US006686740B2

United States Patent
Tschirky et al.

(10) Patent No.: US 6,686,740 B2
(45) Date of Patent: *Feb. 3, 2004

(54) DEVICE FOR THE TRANSPORT AND EXACT POSITIONING OF A SAMPLE TUBE IN A HIGH-RESOLUTION NMR SPECTROMETER

(75) Inventors: Hansjoerg Tschirky, Ettingen (CH); Michael Warden, Pfaffhausen (CH); Roberto Seydoux, Volketswil (CH); Daniel Marek, Moeriken (CH)

(73) Assignee: Bruker Biospin AG, Faellanden (CH)

( * ) Notice: Subject to any disclaimer, the term of this patent is extended or adjusted under 35 U.S.C. 154(b) by 0 days.

This patent is subject to a terminal disclaimer.

(21) Appl. No.: 10/086,347

(22) Filed: Mar. 4, 2002

(65) Prior Publication Data

US 2002/196022 A1 Dec. 26, 2002

(30) Foreign Application Priority Data

Mar. 9, 2001 (DE) .......................... 101 11 674

(51) Int. Cl.[7] ............................................. G01V 3/00
(52) U.S. Cl. ....................................... 324/321; 324/318
(58) Field of Search ................................ 324/321, 318, 324/322

(56) References Cited

U.S. PATENT DOCUMENTS

| 3,911,355 A | * | 10/1975 | Leane et al. ................. 324/321 |
| 4,088,944 A | * | 5/1978 | Engler et al. ................ 324/321 |
| 4,511,841 A | * | 4/1985 | Bartuska et al. ............ 324/321 |
| 4,581,583 A | * | 4/1986 | Van Vliet et al. ........... 324/321 |
| 4,859,949 A | * | 8/1989 | McKenna ..................... 324/321 |
| 5,146,166 A | * | 9/1992 | Bartuska ...................... 324/321 |
| 5,302,900 A | * | 4/1994 | Cummings ................... 324/321 |
| 5,517,856 A | | 5/1996 | Hofmann |
| 6,563,317 B2 | * | 5/2003 | Warden et al. ............... 324/318 |
| 2002/0135372 A1 | * | 9/2002 | Warden et al. ............... 324/321 |
| 2002/0196022 A1 | * | 12/2002 | Tschirky et al. ............. 324/321 |

OTHER PUBLICATIONS

"High Resolution NMR Probeheads", Bruker Group, 1995.

* cited by examiner

Primary Examiner—Diego Gutierrez
Assistant Examiner—Tiffany A. Fetzner
(74) Attorney, Agent, or Firm—Paul Vincent

(57) ABSTRACT

A device for transporting an elongated sample tube (8) into the measuring chamber (22) of an NMR magnet system comprising a spinner which has an axial through-bore through which the sample tube can be inserted, transported together with the spinner on an air cushion into the measuring chamber, and positioned therein relative to the vertical axis of the NMR receiver coil system (9) is characterized by a mounting sleeve (17) which is disposed in a collar-like manner radially around the sample tube such that it cannot slip and which, in the operating position of the sample tube, flatly abuts with one end face thereof on a horizontal stop surface (18) in the bottom region inside a two-stage axial bore (20) of the spinner (7b), wherein the inner diameter of the bore (20), in a first stage in the upper region, is larger than the outer diameter of the mounting sleeve, and the inner diameter of a second stage, in the bottom region of the spinner, is smaller than the outer diameter of the mounting sleeve but larger than the outer diameter of the sample tube. This permits modification of a transport device for NMR measuring capillaries using simple technical means such that it is less sensitive than the conventional devices to curtail breakage of glass.

14 Claims, 4 Drawing Sheets

A — A'

DEVICE FOR THE TRANSPORT AND EXACT POSITIONING OF A SAMPLE TUBE IN A HIGH-RESOLUTION NMR SPECTROMETER

This application claims Paris Convention priority of DE 101 11 674.8 filed Mar. 9, 2001 the complete disclosure of which is hereby incorporated reference.

BACKGROUND OF THE INVENTION

The invention concerns a device for transporting an elongated sample tube, which is filled with a measuring substance, into the measuring chamber of a nuclear magnetic resonance (=NMR) magnet system, and for positioning the sample tube relative to the vertical axis of an NMR receiver coil system, with a spinner which forms part of an air turbine and has an axial through-bore through which the sample tube can be inserted and transported together with the spinner on an air cushion into the measuring chamber and positioned therein relative to the vertical axis of the NMR receiver coil system.

Such a device is known e.g. from the company leaflet "High Resolution NMR, Probeheads" of the Bruker group, 1995.

Modern NMR spectrometers operate almost exclusively with superconducting magnet systems with which the measuring chamber is located deep within the room temperature tube (=RT tube) of the magnet cryostat. Access to this measuring chamber is therefore possible only with auxiliary devices which are operated preferably pneumatically, i.e. with pressurized air. The use of pressurized air is convenient, since it is also required for the air turbine for rotating the NMR sample tube.

A support device is usually located inside the RT tube to which the NMR probe head can be attached. The upper part of this support device has a guiding tube which facilitates air turbine access to the measuring chamber and the stator which is located slightly above same. The rotor (=spinner) of the air turbine in which the measuring sample is located is dimensioned such that it fits into the guiding tube with little play. It serves two purposes: transport of the measuring sample into the measuring chamber and rotation of the measuring sample.

To transport the spinner including sample tube into the measuring chamber, pressurized air is introduced from the measuring chamber which flows upwardly and exits externally through the upper opening of the guiding tube. The spinner, including sample tube, is subsequently disposed on the upper opening of the guiding tube. Since the spinner almost completely covers this opening, an overpressure is generated inside the guiding tube and the spinner rests on an air cushion. If the amount of pressurized air is reduced, a state is eventually reached in which the force produced by the pressurized air supporting the upper position of the spinner is less than the weight of the spinner and measuring sample so that the spinner begins to slowly slide downwardly on the air cushion. The speed at which the spinner descends depends of course on the set pressure of the pressurized air. The spinner and sample tube may therefore strike various structural components in the region of the measuring chamber with relatively large force.

With sample tubes having a diameter of 5 mm and more, the above-described transport method did not pose any serious problems. However, problems occur with smaller diameters, i.e. with measuring capillaries having a diameter of e.g. 2 mm since these are very fragile and even the smallest of impacts can break the glass. For measuring capillaries having a diameter of 1 mm, the danger of breaking glass is so large that their use can barely be justified.

In NMR there is nevertheless a great need for such smallest measuring capillaries since only very small amounts of measuring substance are often available. The development of new and improved transport methods for measuring capillaries is therefore very important for NMR spectroscopy.

Preparation of NMR measuring samples for measurements in an NMR spectrometer is usually done in two steps. In a first step (=preparation phase), the measuring substance is filled into a measuring capillary 8 of glass (=sample) and the measuring capillary is subsequently sealed or covered by a cap. In a second step (=transport phase) the spinner, including the measuring capillary, is transported by means of a pneumatic device through a guiding tube 1*b* from the upper part of the NMR magnet system down to the stator 2*a* of the air turbine, wherein the spinner is thereby supported on an air cushion. At the end of this process, the spinner is disposed on the conical surface of the stator and is centered both with respect to height (=axial) and lateral position (=radial) (FIG. 1). This radial centering aligns the measuring capillary, which projects past the bottom of the spinner and extends inside the supporting tube 10 of the receiver coil 9, to prevent contact between the measuring capillary and the receiver coil.

After measurement of the sample, the pneumatics can remove the sample from the magnet system together with the spinner and the sample can be removed from the spinner. The spinner is then available for measurement of a further sample.

The above-described method is used for all sample diameters down to 1.7 mm. Unfortunately, this method has proven to be very critical for smaller diameters. Measuring capillary glass often breaks. For this reason, there are still no tenable solutions for smaller diameters in the region of 1 mm.

In view of the above, it is the object of the present invention to modify a transport device for NMR measuring capillaries with as simple as possible technical means such that it is less critical than the conventional devices and causes less breakage of glass.

SUMMARY OF THE INVENTION

This object is achieved in accordance with the invention in a surprisingly simple and also effective manner in that a mounting sleeve is disposed, like a collar, radially about the sample tube such that it cannot slip, wherein, in the operating position of the sample tube in the measuring chamber, a horizontal end face of the mounting sleeve is flatly supported on a horizontal stop surface in the bottom region on the inner side of an at least two-stage axial bore of the spinner, wherein a first stage of the bore, disposed in the upper region of the spinner, has an inner diameter which is larger than the outer diameter of the mounting sleeve, and a second stage, in the bottom region of the spinner, has an inner diameter which is smaller than the outer diameter of the mounting sleeve but larger than the outer diameter of the sample tube.

The solution to the inventive problem first required determination of the cause of the frequent glass breakages in the conventional transport devices:

When the spinner 7*a* (shown in FIG. 1 in a device according to prior art) is moved downwardly, the fragile measuring capillary 8 can strike the conical part of the upper mounting part 11 of the support tube 10. Since the measuring capillary is rigidly connected to the relatively heavy spinner 7a, the spinner is also decelerated and, due to its inertial mass, transfers large forces to the measuring capillary which can therefore be easily destroyed. These findings, which the experts had not realized, were an important prerequisite to obtaining the above-described inventive solution, to permit substantially safe transport of the measuring sample.

In contrast to prior art, the inventive device permits mechanical decoupling of the measuring capillary from the spinner in all critical directions. The measuring capillary can be freely moved relative to the spinner in an upper axial direction and in a lateral, radial direction. Its motion is limited in a downward axial direction by a stop disposed on the spinner and fashioned at the second narrowed stage of the modified through-bore. The relative dimensions of the inner diameter of the two-stage through-bore of the spinner on the one hand and of the outer diameter of the mounting sleeve on the other hand are selected in practice such that the mounting sleeve loosely fits into the extended first stage of the through-bore and is laterally movable in a radial direction by approximately ±0.5 mm to ±1 mm or more. Moreover, the mounting sleeve should be constructed such that it is mechanically stable, while nevertheless being as light as possible to minimize the inertial forces which it exerts on the sample tube.

The modified spinner of the inventive device simultaneously serves two different functions due to the cooperation between the shoulder formed by the second stage of the through-bore and the horizontal end face of the mounting sleeve: It serves both as a transport aid for inserting the sample tube into the measuring chamber of the NMR magnet system as well as providing for exact axial positioning of the sample tube relative to the NMR receiver coil system.

A further economically important advantage of the invention is that the spinner must only be modified, relative to the known prior art device, in the region of its through-bore, i.e. its inner structure only. Its outer dimensions can remain unchanged. The new mounting sleeve which is disposed like a collar about the sample tube is disposed inside the spinner in the operating state when the sample is positioned in the measuring chamber of the NMR spectrometer so that the inventive sample transport system is completely compatible for use in existing devices for pneumatic transport of NMR measuring samples.

In embodiments, the mounting sleeve used in the inventive device can have an axial bottom hole with which the mounting sleeve can be slipped over the sample tube from above and can serve as a transport aid, an axial positioning means (described above), and also as a lid for the sample tube.

However, embodiments are preferred with which the mounting sleeve has an axial through-hole bore through which the sample tube can be inserted.

One further development of these embodiments is particularly preferred with which the axial bore of the mounting sleeve has a funnel-shaped extension at its upper end through which liquid sample substance can be filled into the sample tube when the upper end thereof is radially surrounded by the mounting sleeve.

A sample lid can be preferably provided for closing the upper end of the mounting sleeve to hermetically seal-off access to the measuring substance in the sample tube.

One further development is particularly advantageous with which a DOT code is disposed on the sample lid for identifying the measuring substance located in the sample tube to permit automatic and unique identification of the substance to be examined using suitable reading devices.

Increased frictional contact can be used to dispose the mounting sleeve on the sample tube such that it cannot slip. However, a fixed connection to the sample tube, in particular gluing or welding is also possible to securely prevent any slippage of the mounting sleeve when its horizontal end face meets the associated stop surface.

In NMR spectroscopy, exact centering of a sample tube relative to the transmitter and receiver coil is an important prerequisite to obtain maximum sensitivity of the NMR spectrometer. In particular, the radial centering must be extremely accurate since the separation between the receiver coil and the sample tube should be as small as possible to achieve a maximum fill factor. With decreasing sample tube size, the separation between receiver coil and sample tube must be linearly reduced to maintain the same fill factor, and the requirements with regard to the radial positioning accuracy thereof also increase linearly. In the limiting case of a sample tube consisting of a so-called measuring capillary, the requirements with regard to accuracy of the radial centering are particularly high. Such measuring capillaries are mainly used if the amount of measuring substance available is very small.

An arrangement as shown in FIG. 1 is known (see e.g. the above-cited company leaflet by Bruker AG) with which the sample tube 8 is disposed in the rotor 7a of an air turbine (=spinner). This spinner is axially and radially centered at the conical guiding surface of the air turbine stator 2a which is located above the receiver coil 9. The stator, having a conical guiding surface, is not in direct mechanical connection with the receiver coil but is connected, via the lower support part 3, then via the lower part of the probe head 4 and finally via the upper part 5 of the probe head, to the upper and lower mountings 11, 12 of the support tube 10 of the receiver coil 9. The position of the sample tube relative to the receiver coil therefore depends on many individual parts, all having different mechanical tolerances which, in the worst case, could add thereby deteriorating the accuracy and reproducibility of the centering.

In particular, it should be noted that the separation between the conical guiding surface and the receiver coil is relatively large. Consequently, the slightest angular error in the alignment of the axis of the conical guiding surface will have a large influence on the position of the sample tube at the location of the receiver coil. This influence increases with increasing separation between the conical guiding surface and receiver coil.

It is therefore the object of a highly preferred embodiment of the inventive device to further increase the centering accuracy compared to the above-described known devices for obtaining optimum results even with measuring capillary sample tubes having the highest of centering accuracy requirements.

This technical problem is solved by an embodiment of the inventive device with which at least two centering means are provided which are separated from each other in the axial direction of the receiver coil axis and which act on the sample tube exclusively in the radial direction, one of which being disposed above and the other below the receiver coil, and with at least one positioning means which acts on the sample tube exclusively in the axial direction and which can be positioned either below or above the NMR receiver coil, wherein the only radially acting centering devices are rigidly connected to the support device for mounting the receiver coil.

The two axially separated and only radially acting centering means ensure optimum radial centering of the sample tube even if it has a very small diameter which is the case with conventional measuring capillaries as used for the examination of very small substance amounts. The inventive rigid mechanical connection between the two radially acting centering means and the support device to which the NMR receiver coil system is rigidly connected, ensures that the sample tube is necessarily radially centered relative to the NMR receiver coil system. Additionally and irrespective thereof, axial centering is also provided. This produces a very high overall centering accuracy. Moreover, separation of the individual centering functions provides for a larger number of degrees of freedom for the geometric design of the overall centering device, which facilitates centering as geometrically close to the receiver coil system as possible.

One further development of this embodiment is particularly advantageous with which the two centering means which act on the sample tube only in the radial direction, are rigidly connected to one another by means of axially extended support bars disposed in the circumferential direction about the sample tube in its operating position. In this fashion, a rigid connection between the two radially acting centering means can be ensured using extremely simple technical means and a minimum amount of material, to further increase the centering accuracy of the sample tube.

The support bars are preferably disposed symmetrically about the sample tube. This also increases the centering accuracy.

In a particularly preferred manner, precisely three support bars are provided. This is exactly sufficient for the mechanical stability of the rigid connection between the two radial centering means while also allowing for ample space to mount the NMR receiver coil system.

The support bars should, in any event, be produced from a material which has no influence on the NMR measurements. Ceramic, glass or quartz material is preferably used for the support bars.

One further development of the above-described embodiments is particularly preferred with which the NMR receiver coil system is also rigidly connected to the support bars. This provides, using the simplest technical means and the least amount of material, the inventive rigid connection between the NMR receiver coil system and the two radially acting centering means as well as the preferred rigid connection between the two radial centering means themselves, using one single mounting device, i.e. the above-described support bars. This provides optimum centering accuracy.

To achieve the highest possible fill factor, one further development of the above-described embodiments provides that the carrier bars are disposed radially about the NMR receiver coil system with the NMR receiver coil system being mounted to the inside of these support bars.

Further advantages of the invention can be extracted from the description and the drawing. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and explained in more detail with reference to embodiments.

BRIEF DESCRIPTION OF THE DRAWING

FIG. 5b shows a horizontal section along the line A—A of FIG. 5a.

DESCRIPTION OF THE PREFERRED EMBODIMENT

Figure 1:
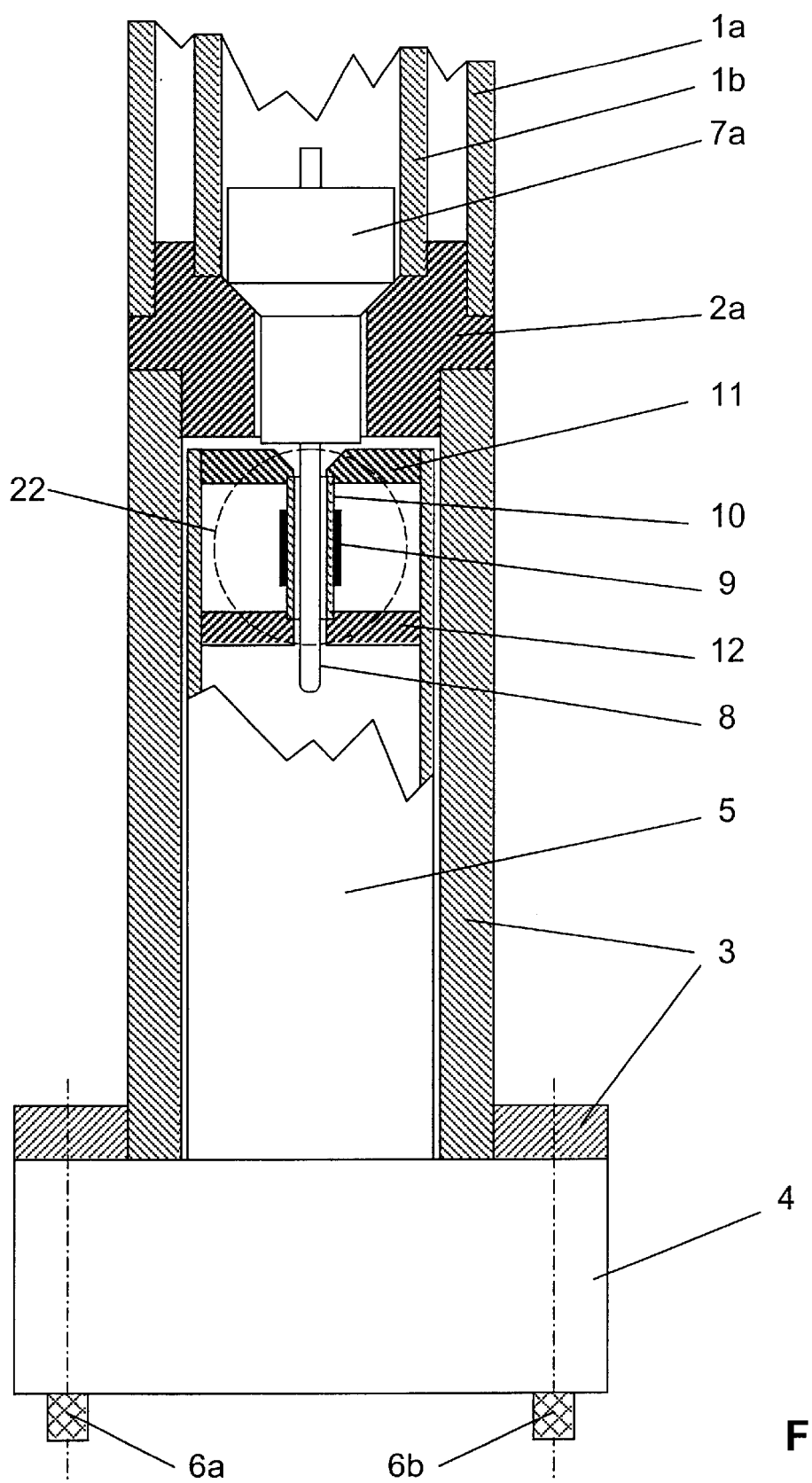
FIG. 1 shows a schematic vertical section through an NMR probe head according to prior art.
Figure 2:
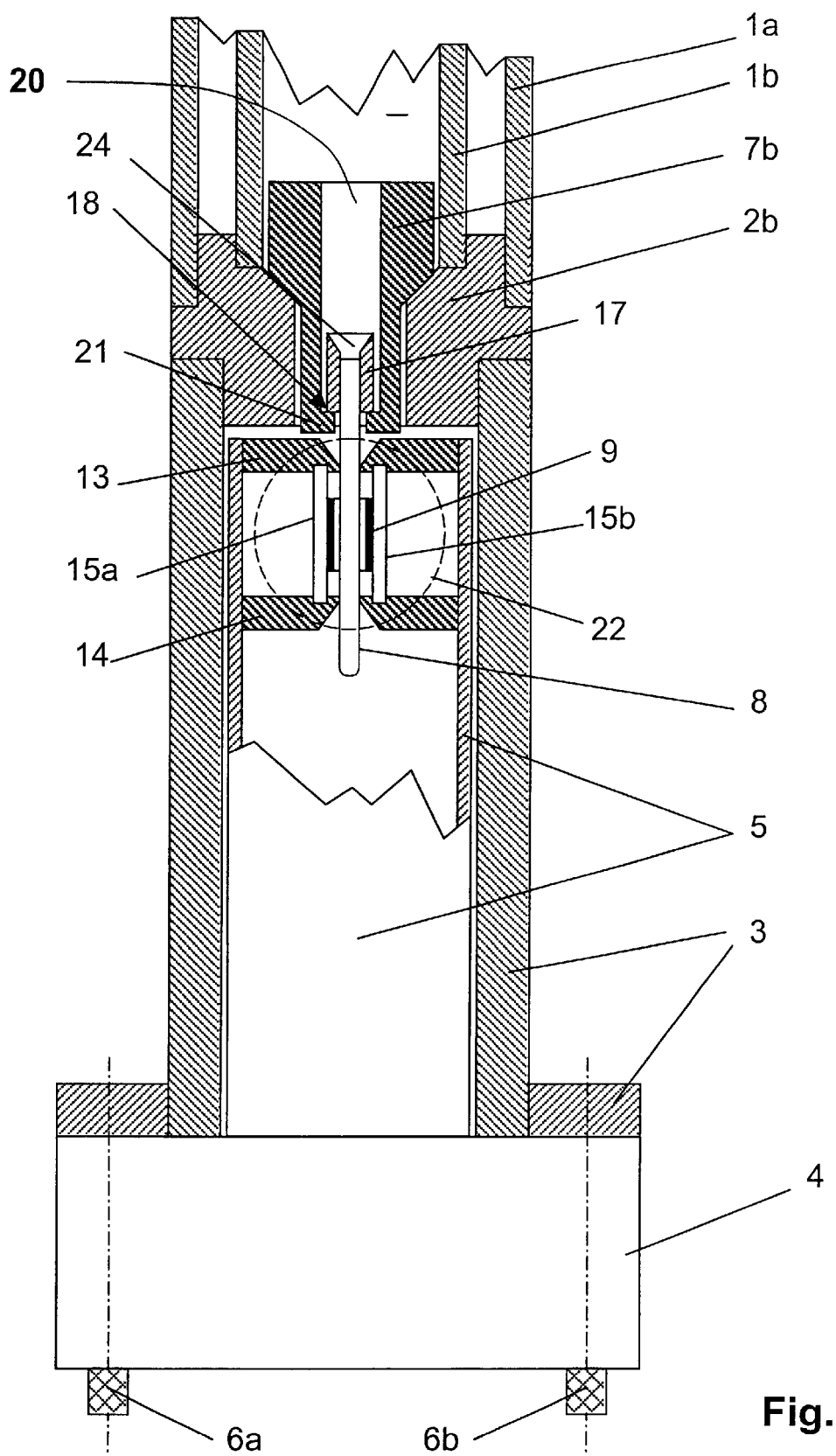
FIG. 2 shows a schematic vertical section through an NMR probe head with an inventive centering device comprising a spinner modified in accordance with the invention and a mounting sleeve, for transport and axial positioning of the sample tube.

FIG. 1 shows a device according to prior art to which an embodiment of the inventive device shown in FIG. 2 can be compared. The first aspect of the invention consists in providing the measuring capillary 8 with a mounting sleeve 17 which is rigidly disposed on the measuring capillary and may also be glued or welded thereto. The measuring capillary 8 and mounting sleeve 17 thereby form an integral unit, wherein the mounting sleeve 17 serves the dual function of both a transporting means as well as a centering aid for axial positioning of the measuring capillary 8.

The second aspect consists in providing the upper part of the spinner 7b with an at least two-stage through-bore 20. Its inner diameter in the first stage at the upper part of the spinner 7b is considerably larger than that of a spinner 7a according to prior art, since the mounting sleeve 17 is supposed to be inserted into the first stage of the bore. A second stage in the bottom region of the spinner 7b is designed to define a shoulder 21 at the lower part of the spinner 7b which simultaneously serves as transport means and centering aid for axial positioning of the sample tube 8 with its mounting sleeve 17. The larger bore of the first stage is dimensioned such that the mounting sleeve 17 has sufficient play for lateral, i.e. radial, free movement relative to the spinner 17. The lateral play should be at least approximately ±0.5 mm to ±1 mm or more. The shoulder 21 in the lower region of the spinner 7b on whose stop surface 18 the mounting sleeve 17 abuts, produces the axial centering.

The spinner 7b whose outer dimensions coincide with those of a conventional spinner 7a is adapted to an existing pneumatic device by means of which it is transported, supported on an air cushion, from the top and through the guiding tube 1b in a downward direction, and back, from the bottom to the top. Since the mounting sleeve 17 can move freely within the spinner 7b in an upward direction and, to a limited degree, also laterally, there is no longer the danger that the fragile measuring capillary strikes the conical part of the upper centering device 13 when the spinner moves downwardly to be subjected to additional forces caused by the relatively large weight of the spinner, which could cause breakage. Due to the fact that there is no fixed connection between the mounting sleeve 17 and the spinner 7b, the measuring capillary can strike the conical part of the centering device 13 and be safely centered there while the spinner 7b continues in a downward direction without carrying along the mounting sleeve 17 with its measuring capillary, to thereby avoid exertion of additional forces on the measuring capillary.

These measures produce a transport device with excellent properties with regard to protection from breakage. The transport process proceeds as follows: As soon as the measuring capillary 8 abuts against the conical part of an upper centering device 13 (whose function is explained in detail below), the heavy spinner 7b can continue to descend further down, unhindered and without carrying along the measuring capillary 8. Even if the measuring capillary is eccentrically incident on the centering device 13, its radial mobility prevents the transfer of forces from the spinner 7b onto the measuring capillary 8. Tests with this new transport device have shown that there is practically no more breakage of glass. In addition, other manipulations with the spinner with measuring capillary, e.g. carrying from one location to another, are less critical. The spinner with measuring capillary was even dropped without causing any damage to the measuring capillary.

The mounting sleeve 17 should be as low-weight as possible, i.e. made from a material which is as light as possible, such as e.g. plastic material having the smallest possible dimensions. This prevents the mounting sleeve 17 from transferring large inertial forces onto the measuring capillary 8.

Figures 3, 4:
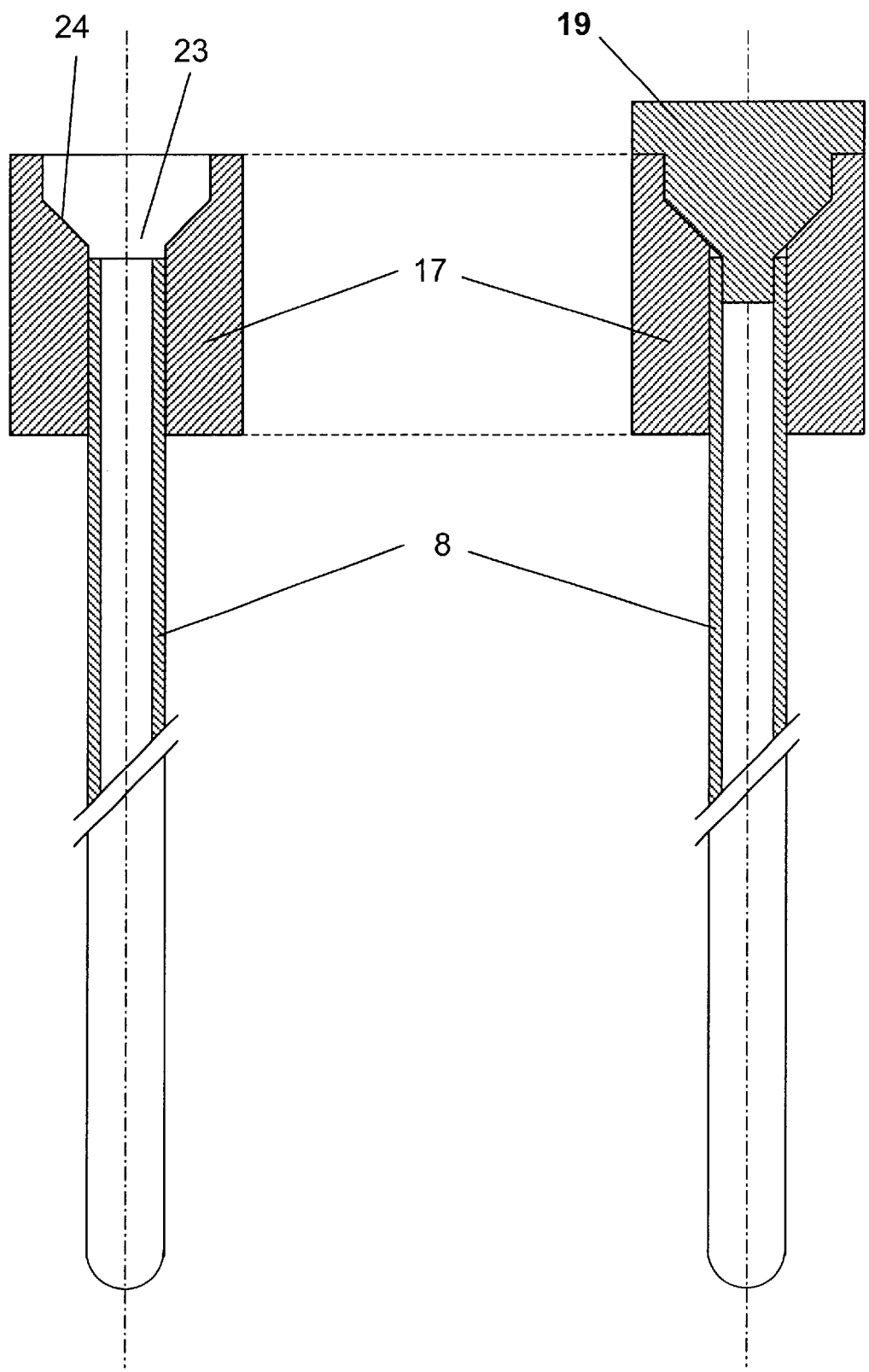
FIG. 3 shows a schematic vertical section through a sample tube with a mounting sleeve disposed, in accordance with the invention, at its upper region in a collar-like manner.
FIG. 4 shows a schematic vertical section through a sample tube with mounting sleeve disposed, in accordance with the invention, in its upper region in a collar-like manner and having a sample lid for closing the sample tube.

The mounting sleeve 17 of the embodiment shown in FIG. 3 has an upwardly disposed funnel 24 to facilitate insertion of a syringe into the sample tube 8 for injecting the sample substance into the sample tube 8.

The mounting sleeve 17 can be provided with a sample lid 19 (FIG. 4) which hermetically seals the sample tube 8 and largely prevents evaporation of the sample substance. A DOT code can also be provided on the sample lid 19, e.g. by imprint, adhesion or burn-in, to permit clear identification of the sample substance during its entire service life.

When the measuring capillary 8 is located in the larger bore of the spinner 7b, the radial movability prevents radial centering, which, in turn, is carried out by other components in the inventive embodiment of FIG. 2, namely by an upper and lower radial centering means 13 and 14, respectively.

The sample tube 8 is thereby only radially centered directly above and below the receiver coil 9 via the two centering devices 13 and 14. Since centering is effected as close as possible to the receiver coil 9 and with as few intermediate parts as possible, high centering accuracy is guaranteed. The minimum allowable separation between this centering device and receiver coil 9 depends on the influence of the susceptibility of the materials used on the NMR resolution. This must be determined by experiments on a case by case basis.

Moreover, since the inventive device produces high radial centering accuracy, the receiver coil 9 can also be mounted inside the support device, i.e. directly about the sample tube 8 and at a very small separation therefrom. As shown in more detail in FIGS. 5a and 5b, the fill factor that can thereby be achieved, is very high. A precondition for such an arrangement is the high radial centering accuracy to prevent damage to the receiver coil 9 when inserting the sample tube 8.

Figure 5A:
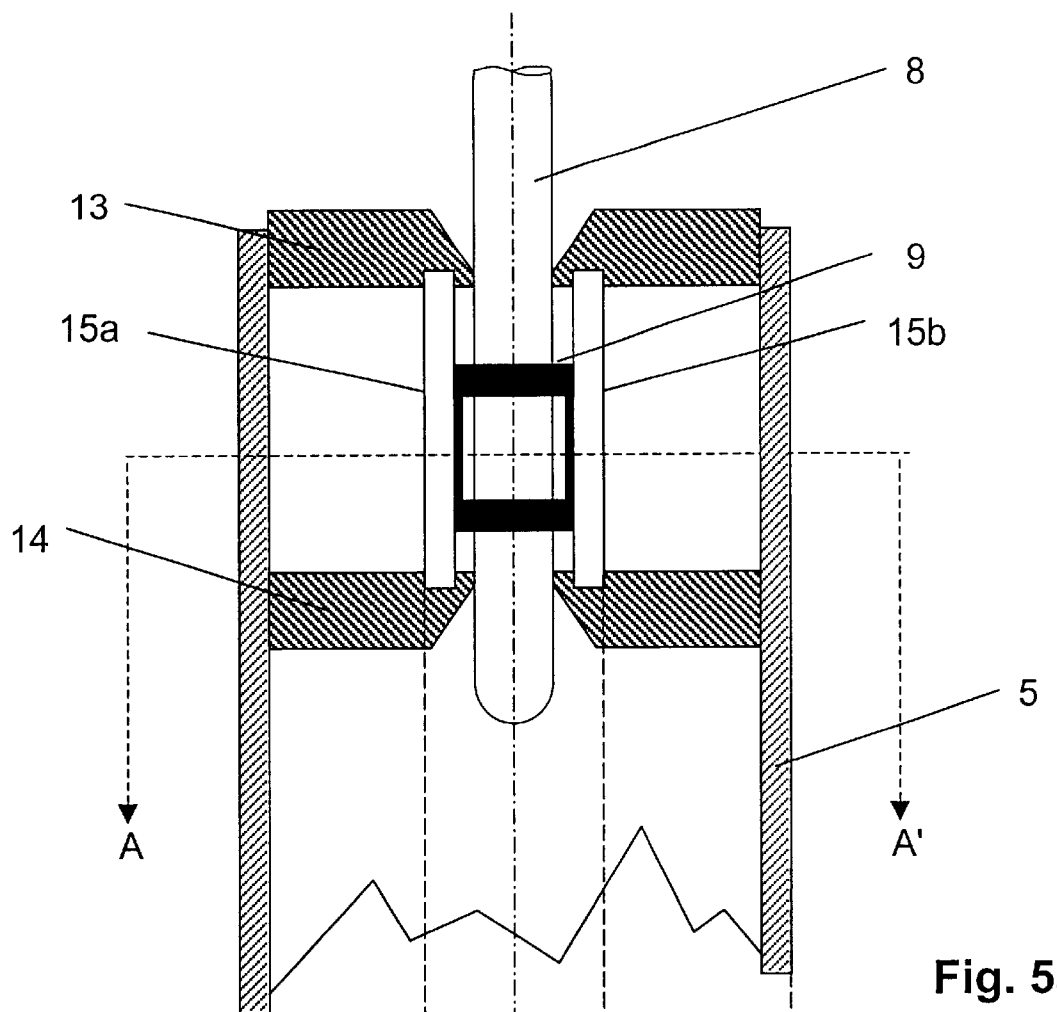
FIG. 5a shows the region around the NMR receiver coil of a device in accordance with FIG. 2 in larger detail.
Figure 5B:
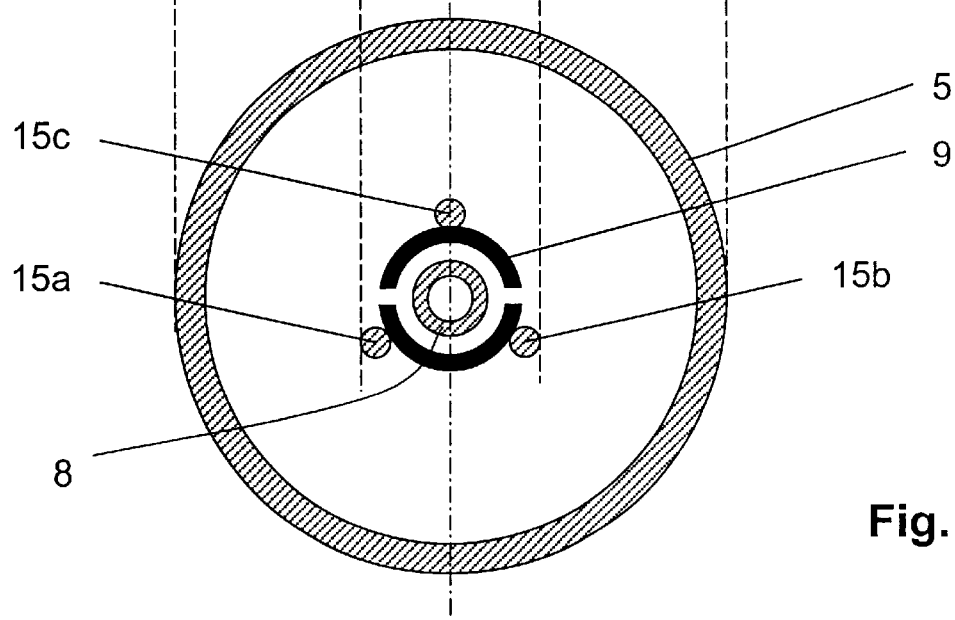

FIGS. 5a and 5b show the inner mounting of the receiver coil 9 to three support rods 15a, 15b and 15c, how the support rods are held by the two radially acting centering devices 13 and 14, as well as the slight contact between the two centering devices 13 and 14 and the sample tube 8 which produces radial centering directly above and below the receiver coil 9.

List of Reference Numerals

| | |
|---|---|
| 1a | upper support part (outer shell) |
| 1b | upper support part (guiding tube for the spinner) |
| 1c | upper support part (lower end flange) |
| 2a | stator of the air turbine of FIGS. 1 and 2 |
| 3 | lower support part |
| 4 | lower part of the probe head |
| 5 | upper part of the probe head |
| 6a, b | fastening screws which can be manually unscrewed to facilitate removal of the probe head |
| 7a | rotor (=spinner) of the air turbine of FIG. 1 according to prior art |
| 7b | rotor (=spinner) of the air turbine of FIG. 2 which simultaneously permits safe transport as well as pure axial positioning of the sample tube 8 |
| 8 | sample tube |
| 9 | receiver coil (saddle-shaped) |
| 10 | support tube of the receiver coil 9 |
| 11 | upper mounting part of the support tube 10 |
| 12 | lower mounting part of the support tube 10 |
| 13 | upper radial centering means for the sample tube 8 which also simultaneously serves as upper mounting of the three support bars 15a, 15b and 15c of the receiver coil 9 |
| 14 | lower radial centering means for the sample tube 8 which also simultaneously serves as lower mounting of the three support bars 15a, 15b and 15c of the receiver coil 9. |
| 15a, b, c | support bars for mounting the receiver coil 9 |
| 17 | mounting sleeve of the sample tube which permits axial positioning of the sample tube in the spinner |
| 18 | abutment surface |
| 19 | sample lid for closing the sample tube and for mounting a "DOT code" for identification of the measuring sample |
| 20 | two-stepped bore of the spinner |
| 21 | lower shoulder in the bottom region of the spinner |
| 22 | measuring chamber |
| 23 | axial through-bore of the mounting sleeve 17 |
| 24 | funnel-shaped extension at the upper end of the mounting sleeve 17 to facilitate filling of the measuring substance into the sample tube 8 |

We claim:
1. A device for transporting an elongated sample tube, filled with a measuring substance, into a measuring chamber of a nuclear magnetic resonance (NMR) magnet system and for positioning the sample tube relative to a vertical axis of an NMR receiver coil system, the device comprising:
an air turbine spinner having an axial bore through which the sample tube can be inserted, transported together with the spinner on an air cushion into the measuring chamber, and positioned therein relative to the vertical axis of the NMR receiver coil system, said axial bore having an upper and a lower bore region, said lower bore region defining a horizontal stop surface proximate a bottom within said lower bore region; and a mounting sleeve, said mounting sleeve disposed in a collar-like manner to directly contact and radially surround the sample tube without slippage relative thereto, said mounting sleeve having a horizontal end face in flat abutment with said horizontal stop surface, wherein said upper bore region has an inner diameter which is larger than an outer diameter of said mounting sleeve and said lower bore region has an inner diameter which is smaller than said outer diameter of said mounting sleeve but larger than an outer diameter of the sample tube, whereby the sample tube is free to move relative to said spinner in a radial direction and in an upward axial direction but is constrained in a downward axial direction through cooperation between said mounting sleeve and said stop surface.

2. The device of claim 1, wherein said mounting sleeve has an axial bore into which the sample tube can be inserted.

3. The device of claim 2, wherein an upper end of said axial bore of said mounting sleeve has a funnel-shaped extension through which liquid sample substance can be filled into the sample tube when an upper end of the sample tube is radially surrounded by said mounting sleeve.

4. The device of claim 2, further comprising a sample lid for closing an upper end of the mounting sleeve.

5. The device of claim 4, wherein said sample lid comprises a DOT code for identifying the measuring substance located in the sample tube.

6. The device of claim 1, wherein said mounting sleeve is fixed to the sample tube.

7. The device of claim 6, wherein said mounting sleeve is glued or welded to the sample tube.

8. The device of claim 1, further comprising at least two centering means which are separated from each other in an axial direction parallel to a vertical axis of the receiver coil system to act on the sample tube in a radial direction only, with one of said centering means being disposed above and an other one of said centering means being disposed below the NMR receiver coil system, and also further comprising at least one positioning means which acts on the sample tube in an axial direction only and at a location above or below the NMR receiver coil system, wherein said centering means are rigidly connected to a support device for mounting the NMR receiver coil system.

9. The device of claim 8, wherein said at least two centering means are rigidly connected to each other by means of axially extended support rods disposed in a circumferential direction about the sample tube in an operating position thereof.

10. The device of claim 9, wherein said support rods are disposed symmetrically around the sample tube.

11. The device of claim 10, wherein three support rods are provided.

12. The device of claim 9, wherein said support rods are made from one of ceramic, glass, and quartz.

13. The device of claim 9, wherein the NMR receiver coil system is also rigidly connected to said support rods.

14. The device of claim 9, wherein said support rods are disposed radially around the NMR receiver coil system.

* * * * *